United States Patent

[11] 3,631,312

[72] Inventors Kenneth J. Moyle
Altos Hills;
Lee P. Madden, Sunnyvale, both of Calif.
[21] Appl. No. 824,878
[22] Filed May 15, 1969
[45] Patented Dec. 28, 1971
[73] Assignee National Semiconductor Corp.
Santa Clara, Calif.

[54] HIGH-VOLTAGE MOS TRANSISTOR METHOD AND APPARATUS
6 Claims, 10 Drawing Figs.

[52] U.S. Cl. 317/235, 317/235 B, 317/235 AN
[51] Int. Cl. H01l 11/14
[50] Field of Search 317/234, 235, 235 (7), 235 (21), 235 (21.1), 235 (40), 235 (40.1), 235 (46), 235 (48), 235 (48.2); 307/304; 29/571

[56] References Cited

UNITED STATES PATENTS

| | | | |
|---|---|---|---|
| 3,434,021 | 3/1969 | Hofstein | 317/235 X |
| 3,461,361 | 8/1969 | Delivorias | 317/235 |
| 3,493,824 | 2/1970 | Richman et al. | 317/235 |
| 3,500,138 | 3/1970 | Richman | 317/235 |
| 3,512,058 | 5/1970 | Khajezadeh et al. | 317/235 |
| 3,403,270 | 9/1968 | Pace et al. | 307/304 |
| 3,405,329 | 10/1968 | Loro et al. | 317/234 |

*Primary Examiner*—John W. Huckert
*Assistant Examiner*—E. Wojciechowicz
*Attorney*—Harvey G. Lowhurst

ABSTRACT: An MIS FET device and method of making the same wherein a device of nominal topology is made capable of sustaining drain to source potentials substantially higher than the normal breakdown potentials of prior art devices. The present invention is constructed with linearly graded PN junctions and the diffusion profile, as related to the geometry of the gate, is such that the junction depletion layer will extend into the drain region to a point under the thick field oxide so that a critical electric field is not produced in the thin gate oxide causing rupture thereof.

INVENTORS
KENNETH J. MOYLE
LEE P. MADDEN

BY

Harvey [signature]
ATTORNEY

INVENTORS
KENNETH J. MOYLE
LEE P. MADDEN

HIGH-VOLTAGE MOS TRANSISTOR METHOD AND APPARATUS

BACKGROUND OF THE INVENTION

The present invention relates generally to metal insulator semiconductor (MIS) devices and, more particularly, to a novel MIS FET device having a drain-to-source breakdown voltage substantially higher than similarly configured prior art devices.

Heretofore, the usefulness of typical MIS transistors as high voltage devices has been limited by at least four characteristics of the devices which are inherent in the structures as they have previously been made. The fourth potential problem areas, which limit the usefulness of the prior art MIS transistors as high voltage devices, relate to the shape of the depletion region, the gate oxide rupture characteristic, the punch-through characteristic and the bulk breakdown characteristic. Because of at least one of these characteristics, breakdown occurs in most MIS transistors and integrated circuits currently available at less than 50 volts drain-to-source.

The shape of the depletion region is strongly influenced by the field which exists between the gate electrode and the depletion region. In the case of MIS devices, which require a thin oxide layer between the gate electrode and the channel area, the gate field causes the depletion layer at the surface of the substrate to bend toward the PN junction so that for a given voltage the electric field near the surface of the substrate is higher than in the bulk and consequently breakdown will occur near the surface at a lower reverse bias than that corresponding to the breakdown voltage of the bulk substrate material. The exact calculation of the field and depletion region shape at the surface of the chip involves solving Poisson's equation in the silicon and Laplace's equation in the oxide layer in accordance with methods known to those of skill in the art.

The relatively low voltage gate oxide rupture characteristic of prior art MIS devices is due to the fact that because of the highly doped drain region and thus the short extension of the depletion region into the drain region, the thin oxide layer typically extends over the drain region to an extent exceeding the edge of the depletion region so that the field concentration which occurs at the "corner" lies under the thin oxide. The resulting high field in the thin oxide region can produce rupture at between 50 and 110 volts gate-to-drain depending on the oxidation technique and thickness.

The punch-through problem is primarily one caused by the spacing between the source and drain regions. In prior art devices, as the drain-to-source potentials approach 50 volts, the depletion region, which lies almost entirely outside of the drain region may extend through the channel region and "-punch-through" to the highly doped source region thus limiting the breakdown voltage. If the drain-to-source separation is increased in order to eliminate this problem, a sever penalty in gain is paid since the spacing therebetween is an inverse function of gain (transconductance).

The bulk breakdown is determined primarily by the bulk resistivity of the substrate material and the field concentration across any part thereof. If at any point across the depletion region the critical field is caused to exist, the carriers will be accelerated to a high enough velocity so as to cause an avalanche condition and the resultant breakdown. Bulk breakdown usually occurs at the relatively sharp bends in the PN-junction caused by the shallow depth of the drain region. This problem could obviously be solved by increasing the substrate resistivity, but to do so would obviously lower the punch-through potential of the device.

Although there have been previous attempts to overcome the above-mentioned problems, these attempts have generally been unsatisfactory because they have primarily been directed to the obvious solutions of utilizing a thicker oxide layer, a differently configured oxide layer, a wider drain-to-source spacing and/or a different substrate material resistivity. These attempts, however, have typically been found unsatisfactory because changes in configuration or oxide thickness usually destroys the gain characteristics of a particular device and other changes such as increasing the resistivity of the substrate material usually have the effect of prejudicing other operational characteristics of the device.

OBJECTS OF THE INVENTION

It is therefore a principal object of the present invention to provide a novel method of producing an MIS FET device having voltage breakdown characteristics superior to those of similar prior art devices.

Another object of the present invention is to provide a novel MIS FET device having a drain-to-source breakdown voltage which exceeds 60 volts.

Still another object of the present invention is to provide an MIS FET device that is capable of sustaining substantially higher drain-to-source voltages than was heretofore possible using similar FET topology and oxide thickness.

Still another object of the present invention is to provide a novel MIS FET device having stable operational characteristics and which is not subject to rupture of the gate dielectric when operated at drain-to-source voltages of at least 100 volts for sustained periods of time.

Still another object of the present invention is to provide a novel MIS FET device which is operational at voltages of at least 100 volts without danger of destruction due to field-plate effect electric field distortion, gate oxide rupture, punch-through or bulk breakdown.

SUMMARY OF THE PRESENT INVENTION

The novel MIS FET device of the present invention is provided by carefully positioning the gate opening in a predetermined relationship with respect to drain region and by utilizing a low impurity concentration in the drain region so as to form deep linearly graded PN-junction. Accordingly, the boundary of the depletion region in the drain region, at drain-to-source potentials in the vicinity of 100 volts, is caused to extend outside of the limits of that portion of the gate metal which is disposed over the thin oxide in the channel region. By constructing the FET device in accordance with the method of the present invention, the field established between the gate electrode and the drain region is distributed so as not to become critical in the thin oxide region even though the actual potential difference between the gate electrode and the drain region may exceed the rupture potential of the thin oxide layer.

In accordance with the present invention, the four problems mentioned above are circumvented to substantially improve the breakdown characteristics of the MIS device. Such innovation broadens the field of application of MIS devices to areas wherein a larger potential handing capability than 50 volts is required.

As one example, FET's have been used in the past to store information for driving neon tubes. But since such applications require voltages high enough to keep the tubes turned off in the reverse direction and because these voltages generally exceed the breakdown voltages of available FET devices, the use of external transistors having higher breakdown voltages were required between the neon tubes and the MIS FET device. MIS devices provided in accordance with the present invention no longer require the use of external transistors and can be connected directly to the high-voltage load. By thus improving the voltage breakdown characteristics of the present device, it is made suitable for applications wherein the use of FET devices alone has heretofore been precluded due to their relatively low breakdown potentials.

Another advantage of the present invention is that there is no material change in the topology or the oxide thickness of the device involved and thus the operating characteristics of the novel device are substantially the same as those of similarly configured prior art devices.

Still another advantage of the present invention is that the novel method permits the formation of multiple FET devices on the same chip with each having the same gate oxide thickness but with some having higher voltage breakdown characteristics than others.

Other advantages of the present invention will become apparent to those of skill in the art after having read the following detailed disclosure which makes reference to the several FIGS. of the drawing.

IN THE DRAWING

DETAILED DESCRIPTION OF THE PREFERRED EMBODIMENTS

Figure 1:
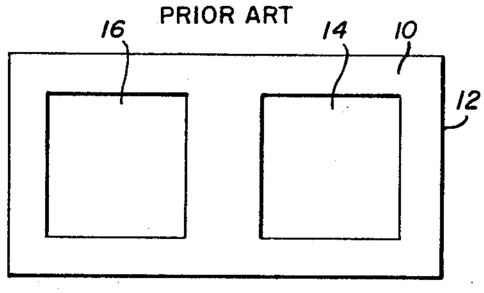
FIG. 1 is a top view of a chip of semiconductive substrate illustrating the prior art mask openings for the source and drain regions of an MIS FET device.

Referring now to FIGS. 1 through 5 of the drawing, there is shown for purposes of illustration the manner in which a typical prior art MIS FET device is constructed. As is shown in FIG. 1 of the drawing, an oxide mask 10 is prepared over a wafer of silicon substrate material 12 and high concentration impurities are predeposited over the mask apertures 14 and 16 preparatory to forming, by diffusion, a source region and a drain region. The chip 12 is then subjected to a high temperature diffusion process wherein the predeposited impurities disposed over the apertures 14 and 16 are driven into the substrate 12 a predetermined distance to form source and drain regions as illustrated by the dashed lines 18 and 20 respectively, in FIG. 2.

It will be noted that the surface areas of the regions 18 and 20 are slightly larger than the areas of the mask openings 14 and 16 since during diffusion the impurities are caused to diffuse outwardly away from the locus of the original predeposition as well as vertically downward into the substrate. The vertical depth and lateral spread, however, is purposely kept small so that the impurity concentration will be high in the source and drain regions.

Figure 3:
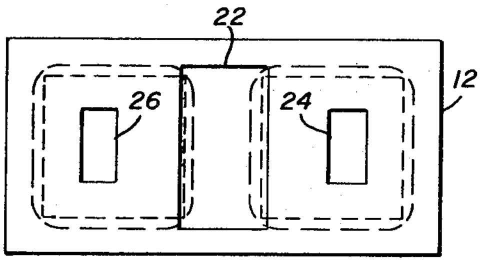
FIG. 3 illustrates the mask openings for the source and drain contacts used in making the prior art device.
Figure 8:
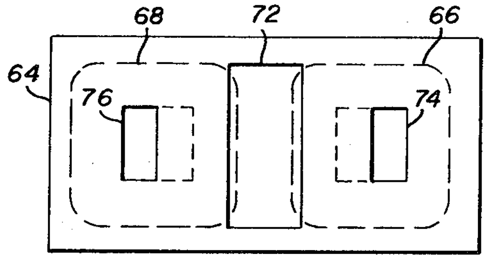
FIG. 8 illustrates the mask openings for the source and drain contacts used in making the novel MIS FET device.

An oxide is then grown over the upper surface of the wafer 12 followed by a masking and etching stage to remove the field oxide from the gate region 22 which slightly overlaps the source and drain regions 18 and 20. After the thick oxide has been removed from the gate region 22, a clean stable oxide of approximately 1,000 A in thickness is grown thereover. The wafer 12 is then subjected to another masking and etching step to remove the oxide from the contact areas 24 and 26 as shown in FIG. 3. Subsequently, a suitable interconnect metal is evaporated over the entire surface of the wafer 12. Following the evaporation of the metal, the wafer is again masked and the metal etched leaving only those portions in the areas 28, 30 and 32 which provide source and drain interconnects 28 and 30, and a gate electrode 32, respectively, as illustrated in FIG. 4.

Figure 4:
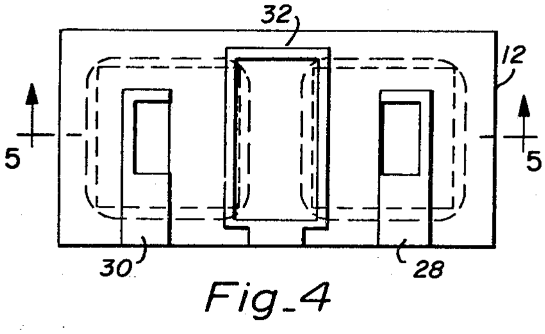
FIG. 4 is a top view of a completed FET device constructed in accordance with the prior art.
Figure 9:
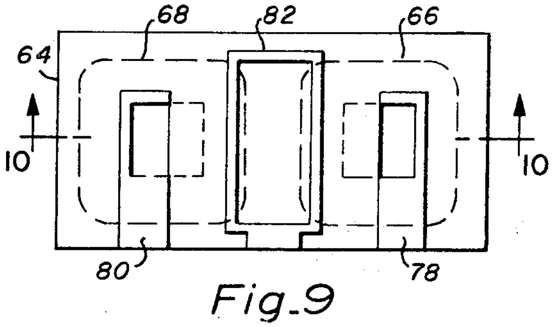
FIG. 9 is a top view of a completed FET device constructed in accordance with the present invention.
Figure 5:
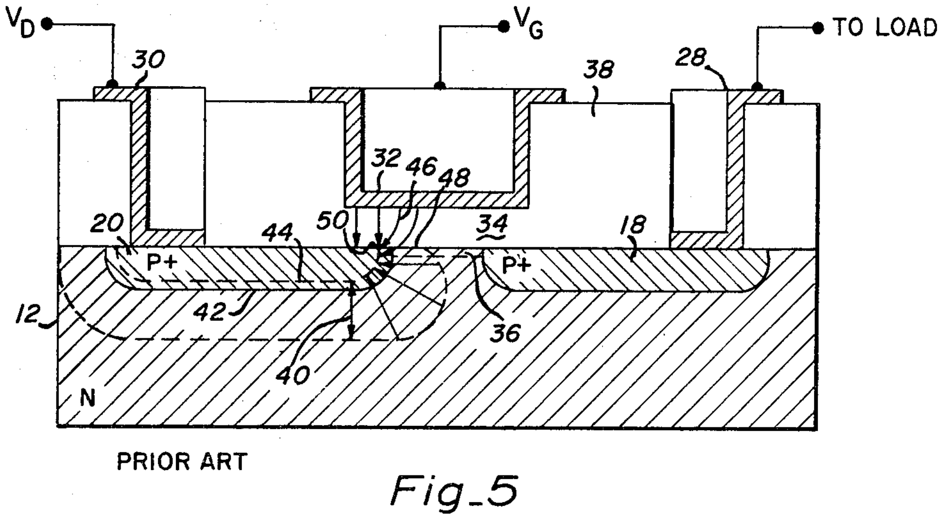
FIG. 5 is a cross section of the prior art FET device of FIG. 4 taken along the lines 5—5.

FIG. 5 is a cross section of the device illustrated in FIG. 4 taken along the line 5—5 and showing the vertical relationship of the respective component elements. Although not drawn to scale, it will b3 noted from this cross section that the oxide layer 34 which separates the gate 32 from the channel region 36 is substantially less in thickness than the field oxide 38 which covers the chip 12. A typical thickness of the gate oxide 34 is 1,000 A while the field oxide 38 is typically 10,000 A thick.

With the drain region 20 reverse biased, a depletion region 40 is caused to form about the PN-junction 42 between drain region 20 and the silicon substrate 12 which, because of the differences in concentration of the P-type impurities and the N-type impurities in their respective portions of the wafer, extends much further into the substrate 12 than into the more highly doped drain region 20. Thus, as is illustrated in FIG. 5, the outer limit 44 of the depletion layer 40 in the drain region 20 lies directly beneath the gate electrode 32 and the thin oxide 34.

An examination of this typical MIS transistor structure indicates, as was pointed out above, at least four potential problems which will limit its usefulness as a high-voltage device. First, the shape of the depletion layer 40, as illustrated in FIG. 5, is strongly influenced by the "field-plate effect" which causes the depletion region 40 to be bent inwardly at the surface 48 of the wafer so that as the drain-to-source potential approaches the upper end of the operating range a critical field may be reached before the bulk breakdown potential is reached.

The exact calculation of the field and depletion region shape at the surface 48 involves solving Poisson's equation in the silicon and Leplaces's in the oxide layer. Under the specific conditions illustrated in FIG. 5, the gate field 46 causes the depletion layer at the surface 48 to bend towards the PN-junction 42, so that the critical field for the occurrence of avalanche breakdown is reached at the surface sooner than would be the case in the absence of the gate electrode 32. Since thin oxides, on the order to 1,000 A, are required for reasonable thresholds and transconductance, this field-plate effect limits prior art MIS devices to about 45 volts source-to-drain breakdown.

Secondly, the thin oxide region 34 of most prior art devices is extended at least 0.2 mil over the drain region 20. However, because of the higher impurity concentrations used in the prior art devices the depletion region 40 typically extends into the drain region somewhat less than this distance so that as a result a high field is created in the thin oxide at the "corner" 50 which can cause irreversible oxide rupture at between 50 and 110 volts depending on the oxidation technique and actual thickness of the layer 34.

Thirdly, the operating potential applied to the drain region 20 may be sufficient to cause the depletion region 40 to extend through the gate region 36 and "punch-through" to the highly doped source region 18 thus also limiting the breakdown voltage. If the source and drain separation is increased in order to eliminate this problem, a severe penalty in gain is paid.

And lastly, the drain bulk breakdown may not be adequate to support a higher voltage even if the other problems were circumvented. If the substrate resistivity is increased in order to avoid this problem, the depletion layer width would increase and the punch-through problem would become a material factor in determining the breakdown potential of the device.

Figure 6:
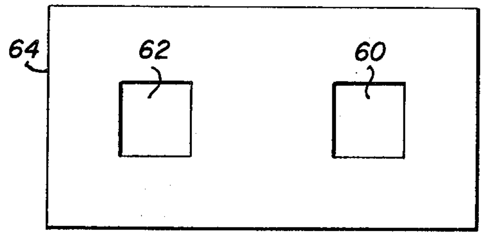
FIG. 6 is a top view of a chip of semiconductive substrate illustrating the mask opening used to make the source and drain regions of an MIS FET device in accordance with the present invention.
Figure 2:
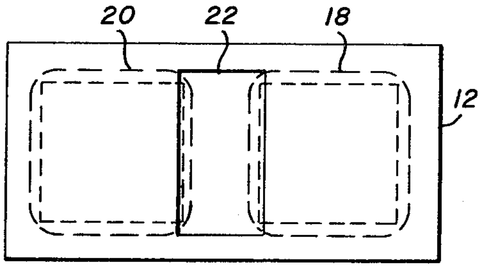
FIG. 2 illustrates the source and drain limits after diffusion, and the gate mask opening used in making the prior art MIS FET device.

Turning now to FIGS. 6 through 10 of the drawing, the method of the present invention will be disclosed in detail. In FIG. 6, it will be noted that the masking apertures 60 and 62 for accommodating the source and drain predepositions, respectively, are smaller and spaced somewhat further apart on the wafer 64 than were the respective mask openings used in making the prior art devices. As an example, the spacing between the source and drain mask openings 60 and 62 might be 0.8 mils as opposed to the substantially closer separation of the corresponding openings used in the prior art as illustrated in FIG. 1.

Figure 7:
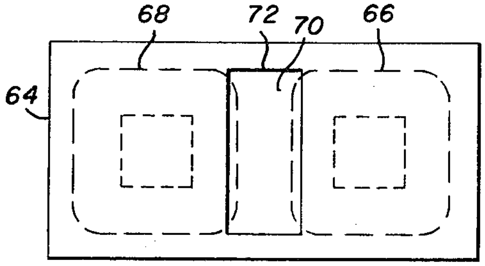
FIG. 7 illustrates the limits of the source and drain regions of the new device after diffusion and shows the gate mask opening therefor.

Furthermore, the dopant used to form the predepositions is of a lower concentration than is typically used in making the prior art device. After predepositing the desired impurity, boron for example, over the wafer 64, the wafer is subjected to a relatively long period of diffusion so as to cause the impurities to diffuse through the openings 60 and 62 and into the substrate 64 to form source and drain regions 66 and 68, respectively, which have approximately the same final surface area as those of the prior art, as is illustrated in FIG. 7. The lightly doped source and drain regions produced by the long diffusion time have deep linear graded PN-junctions. The diffusion time is selected such that even though the starting surface areas of the predepositions were considerably smaller and spaced farther apart than in the prior art, the resultant gate length, i.e., the spacing between source and drain, is still maintained at approximately 0.2 mils.

After the source and drain regions 66 and 68 are diffused into the wafer 64 and suitable field oxide is grown over the surface thereof, the wafer is masked and etched to remove the field oxide from the gate region 70. It is to be noted that the mask opening 72 lies substantially within the space separating the mask openings 60 and 62 used to form the source and drain regions. In a typical example, the gate mask opening 72 lies inside of the source and drain openings 60 and 62 used to form the source and drain regions. In a typical example, the gate mask opening 72 lies inside of the source and drain openings 60 and 62 by 0.2 mils on each side so that the gate electrode to be subsequently formed only overlaps the source and drain regions by 0.05 mil. This is to be contrasted with prior art methods wherein even the gate mask opening overlaps the source and drain mask openings by 0.1 to 0.2 mils.

After the gate area 70 has been etched, a clean stable oxide of approximately 1,000 A thick is grown thereover. The wafer is then again masked and etched to remove the field oxide from the contact regions 74 and 76 after which an evaporation of a suitable metal is made over the surface of the wafer to provide an interconnection pattern. Following this metallization, the wafer 64 is again masked and etched leaving only that metal in the areas 78 and 80, which serve as interconnects to the source and drain regions 66 and 68, and that in the area 82 which provides the gate electrode and interconnect therefor.

Figure 10:
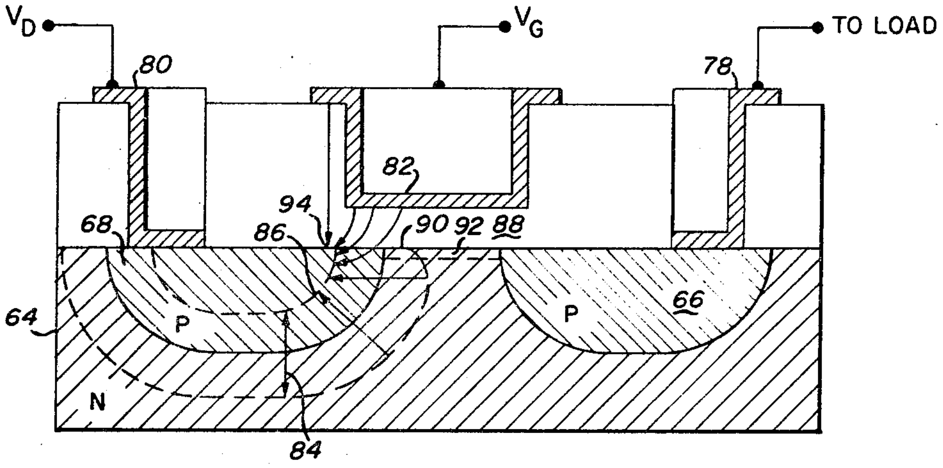
FIG. 10 is a cross section of the novel device illustrated in FIG. 9 taken along the lines 10—10.

Referring now to FIG. 10 of the drawing, it will be noted that the device formed in accordance with the present invention physically resembles that of the prior art illustrated in FIG. 5 with the exception that the impurity concentrations in the source and drain regions 66 and 68 are more lightly doped than in the prior art and the respective PN-jnctions are substantially deeper than in the prior art device. The predeposition and diffusion cycles are designed to produce a linearly graded impurity concentration profile in the source and drain regions. As a result of this linearly graded concentration profile in the drain region 68, the depletion region 84, formed when the drain 68 is biased negatively with respect to the bulk 64, is caused to extend substantially farther into the drain region 68 than was the case in the more highly doped drain region of the prior art device.

Consequently, as illustrated in FIG. 10, the drain boundary 86 of the depletion region 84 extends out from under the thin oxide 88 under the gate 82 so as to fall beneath a thick oxide region. As a result, the concentration of the electric field at the "corner" 94 falls outside the thin oxide layer 88 and thus under the thicker field oxide so that a substantially higher potential difference between the gate electrode 82 and the drain region 68 is permitted without causing an irreversible rupture of the oxide. Thus, one of the critical operational limitations is circumvented by effectively raising the oxide rupture potential to a substantially higher voltage. In accordance with the present invention, the rupture potential may be as high as 400 volts in comparison with the 50–100 volts of the prior art device.

Furthermore, the distortion of the depletion region at the surface 90 is caused by the field-plate effect is of lesser importance since the width of the depletion layer in the gate region 92 has been substantially reduced. The limitation imposed by the bulk breakdown is circumvented by diffusing the junction deeper. The reduced junction curvature of the deeper junction permits a higher bulk breakdown voltage to be sustained for a given bulk resistivity. In addition, it is well known to those of skill in the art that a linear graded junction will support a higher breakdown voltage than a step junction such as is illustrated in FIG. 5 for a given bulk resistivity.

In addition, using this structure the possibility of depletion layer punch-through to the source region 66 at standard gate lengths is substantially reduced because of the fact that about half of the depletion layer 84 extends into the drain region 68 rather than into the gate region 92.

A method in which MIS FET's may be made in accordance with the present invention may be concisely stated as follows:

1. The silicon wafer 64 is initially cleaned and an oxide of approximately 3,000 A thickness is grown over the surface thereof;

2. Next, the wafer is photolithographically masked and the oxide is etched to open the source and drain beds 60 and 62. The initial source to drain spacing is preferably 0.8 mils (approximately 21 microns);

3. Where the substrate 64 is N-type, a predeposition of boron (a P-type impurity) is made over the source and drain regions 60 and 62. The wafer is then subjected to a diffusion environment under conditions sufficient to yield a surface concentration of $1.8\times10^{17}$ atoms per cubic centimeter ($\pm$ 10 percent) and a junction depth of 8 microns ($\pm$1.0 microns);

4. The wafer is then subjected to an oxidation cycle to grow a "thick" field oxide 66 thereover to a thickness of approximately 10,000 A. This oxidation is typically done in wet oxygen ambient at temperatures low enough so that additional diffusion is not a consideration. Due to the redistribution of impurities during thermal oxidation, the surface concentration of boron in the drain and source regions is further reduced. At this point, the source and drain regions 66 and 68 have been fully formed as illustrated in FIG. 7 and the channel region 70 has been reduced to approximately 0.3 mils in length;

5. The wafer is subsequently photolithographically masked again and the gate region is etched to remove field oxide from above the gate region 72. The width of the gate opening is 0.4 mils (10 microns).

6. A gate oxidation is performed to grow a clean stable oxide 88 of approximately 1,000 A thickness in the gate region 70;

7. The wafer is again photolithographically masked and etched to remove oxide from the contact regions 74 and 76 of the source and drain beds 66 and 68, respectively;

8. Pure aluminum is then evaporated over the surface of the wafer to a thickness of approximately 10,000 A;

9. The wafer is again photolithographically masked and etched to from the metallic interconnects 78 and 80 and the gate electrode 82.

10. Finally, the wafer is alloyed to establish ohmic contacts between the aluminum interconnects 78 and 80 and the source and drain beds respectively. Alloying completes the wafer fabrication phase of the process.

In accordance with this novel process, it should be noted that the spacing between the original source and drain mask openings was 0.8 mils wide and the gate mask opening was 0.4 mils wide so that the gate mask opening lay inside the space between the original source and drain openings and was separated therefrom by 0.2 mils on each side. This is to be noted in contradistinction with the methods used to make MIS structures now available wherein the gate mask opening typically overlaps the source-drain mask openings by 0.1 to 0.2 mils.

In integrating this structure, it may be desirable to use the source-drain predeposition and diffusion schedule described above only for the high breakdown transistors. In this way, the higher sheet resistance resulting from this process is avoided for the bulk of the circuitry. To form an MIS transistor of the type disclosed in an integrated circuit, an additional oxidation and photolithographic masking, and source predeposition at higher surface concentrations can be performed between the process steps 3 and 4 above.

Additionally, in order to reduce the contact resistance in the P-regions, the P-regions may be highly doped in the contact areas 74 and 76. Thus, in accordance with the present invention a method is provided for producing a novel MIS FET device that is capable of sustaining drain-to-source voltages which are higher than the gate oxide breakdown voltage. The diffusion profile, as related to the geometry of the gate, is such that the device, when operating, will permit the depletion layer to extend into the drain region under a thick oxide layer so that an excessive electric field concentration does not appear in the thin oxide of the gate region.

Under these circumstances and because of the interaction of the electric fields created between the gate electrode 82 and the depletion region terminus 86, and that across the depletion region 84 the four principal problems relating to the prior art devices mentioned above have been obviated and a high-voltage MIS FET provided. As an example, an FET manufactured in accordance with this process and having a thin oxide layer 88 with a rupture potential of approximately 100 volts, can be made capable of withstanding a voltage as high as 140 volts between source and drain without rupture of the thin oxide layer 88, punch-through, or bulk breakdown.

Although the present invention has been described in terms of a P-channel device, it is to be understood that the process can likewise be utilized to produce an N-channel device and in addition, any metal interconnection system and any gate dielectric material can be used. Similarly, the values which have been cited are merely illustrative. Furthermore, after having read the above disclosure, it is contemplated that certain alterations and modifications of the invention may become apparent to those of skill in the art. Therefore it is to be understood that this description is of a preferred embodiment only and is in no manner intended to be limiting in any way. Accordingly, it is intended that the appended claims be interpreted as covering all modifications which fall within the true spirit and scope of the invention.

What is claimed is:

1. An improved MIS FET device having a source-to-drain breakdown voltage exceeding 60 volts comprising:
   - a substrate of a first conductivity type;
   - a drain region of a second conductivity type, which is opposite to said first conductivity type, formed in said substrate and defining an NP-junction therewith, the impurity concentration profile in said drain region being linearly graded at least adjacent said junction;
   - a source region of said second conductivity type formed in said substrate in spaced-apart relationship with said drain region; and
   - a gate electrode disposed above the region of said substrate separating said source and drain regions, said gate electrode being positioned to extend over said junction.

2. An improved MIS FET device as recited in claim 1 wherein the depth of said junction is at least 0.2 mil deep.

3. An improved MIS FET device as recited in claim 1 wherein said substrate is of an N-type impurity and said drain region is of a P-type impurity having a surface concentration of less than $2\times10^{18}$ atoms per cubic centimeter.

4. An improved MIS FET device having a source-to-drain breakdown voltage exceeding 60 volts comprising:
   - a substrate of a first conductivity type;
   - a drain region of a second conductivity type, which is opposite to said first conductivity type, formed in said substrate and defining an NP-junction therewith, the impurity concentration profile in said region being linearly graded at least adjacent said junction;
   - a source region of said second conductivity type formed in said substrate in spaced apart relationship with said drain region; and
   - a gate electrode disposed above the region of said substrate separating said source and drain regions, said gate electrode being positioned to extend over said junction and having an edge disposed between said junction and the inside corner of the depletion region.

5. An improved MIS FET device as recited in claim 4 in which the impurity concentration at the surface of said drain region is less than $2\times10^{18}$ atoms per cubic centimeter.

6. An improved MIS FET device having a source-to-drain breakdown voltage exceeding 60 volts comprising:
   - a substrate of a first conductivity type;
   - a drain region of a second conductivity type, which is opposite to said first conductivity type, formed in said substrate and defining an NP-junction therewith, the impurity concentration profile in said region being linearly graded at least adjacent said junction;
   - a source region of said second conductivity type formed in said substrate in spaced apart relationship with said drain region; and
   - a gate electrode disposed above the region of said substrate separating said source and drain regions, said gate electrode being positioned to extend over said junction and having an edge overlying said drain region opposite the depletion region across the portion of said junction immediately adjacent the region of said substrate separating said source and drain regions.

* * * * *